US009131608B2

(12) United States Patent  
Oi

(10) Patent No.: US 9,131,608 B2  
(45) Date of Patent: Sep. 8, 2015

(54) WATERPROOF TYPE ELECTRONIC APPARATUS

(71) Applicant: KYOCERA Corporation, Kyoto-shi, Kyoto (JP)

(72) Inventor: Atsuki Oi, Yokohama (JP)

(73) Assignee: KYOCERA Corporation, Kyoto (JP)

(*) Notice: Subject to any disclaimer, the term of this patent is extended or adjusted under 35 U.S.C. 154(b) by 147 days.

(21) Appl. No.: 13/722,232

(22) Filed: Dec. 20, 2012

(65) Prior Publication Data

US 2013/0176665 A1 Jul. 11, 2013

(30) Foreign Application Priority Data

Jan. 5, 2012 (JP) .................................. 2012-000314

(51) Int. Cl.
| | |
|---|---|
| *H04M 1/18* | (2006.01) |
| *H05K 5/06* | (2006.01) |
| *H04M 1/23* | (2006.01) |
| *H04B 1/3888* | (2015.01) |

(52) U.S. Cl.  
CPC ............... *H05K 5/06* (2013.01); *H04B 1/3888* (2013.01); *H04M 1/18* (2013.01); *H04M 1/23* (2013.01); *H05K 5/061* (2013.01)

(58) Field of Classification Search  
CPC .................................. H02G 3/088; H04M 1/18  
USPC .................................. 174/260, 50.5; 200/341  
See application file for complete search history.

(56) References Cited

U.S. PATENT DOCUMENTS

| 2003/0109229 A1* | 6/2003 | Takagi ............................. 455/90 |
| 2005/0224326 A1* | 10/2005 | Oikawa ....................... 200/302.1 |
| 2007/0272534 A1* | 11/2007 | Iohara ............................ 200/512 |
| 2008/0015000 A1* | 1/2008 | Jung .......................... 455/575.1 |

FOREIGN PATENT DOCUMENTS

| JP | SHO 61-129236 U | | 8/1986 |
| JP | H09-259697 A | | 10/1997 |
| JP | H11-026952 A | | 1/1999 |
| JP | 2005-032555 A | | 2/2005 |
| JP | 2005-340682 A | | 12/2005 |
| JP | 2005340682 A | * | 12/2005 |
| JP | 2008-077850 A | | 4/2008 |

OTHER PUBLICATIONS

Office Action dated Apr. 28, 2015 issued in counterpart Japanese application No. 2012-000314.

* cited by examiner

*Primary Examiner* — William H Mayo, III  
*Assistant Examiner* — Krystal Robinson  
(74) *Attorney, Agent, or Firm* — Procopio, Cory, Hargreave & Savitch LLP

(57) ABSTRACT

A waterproof type electronic apparatus of the present invention includes a key sheet at which a plurality of operation keys are formed, a front panel having its front face fixedly bonded to the circumferential portion of the key sheet, and a pushing element sheet interposed between the front panel and the switch sheet. The front panel is provided with a plurality of openings corresponding to ones of the operation keys. At the pushing element sheet, a plurality of pushing elements is formed. A waterproof packing extends passing through the position at which it overlaps with the opposite side portions of the circumferential portion of the key sheet.

6 Claims, 4 Drawing Sheets

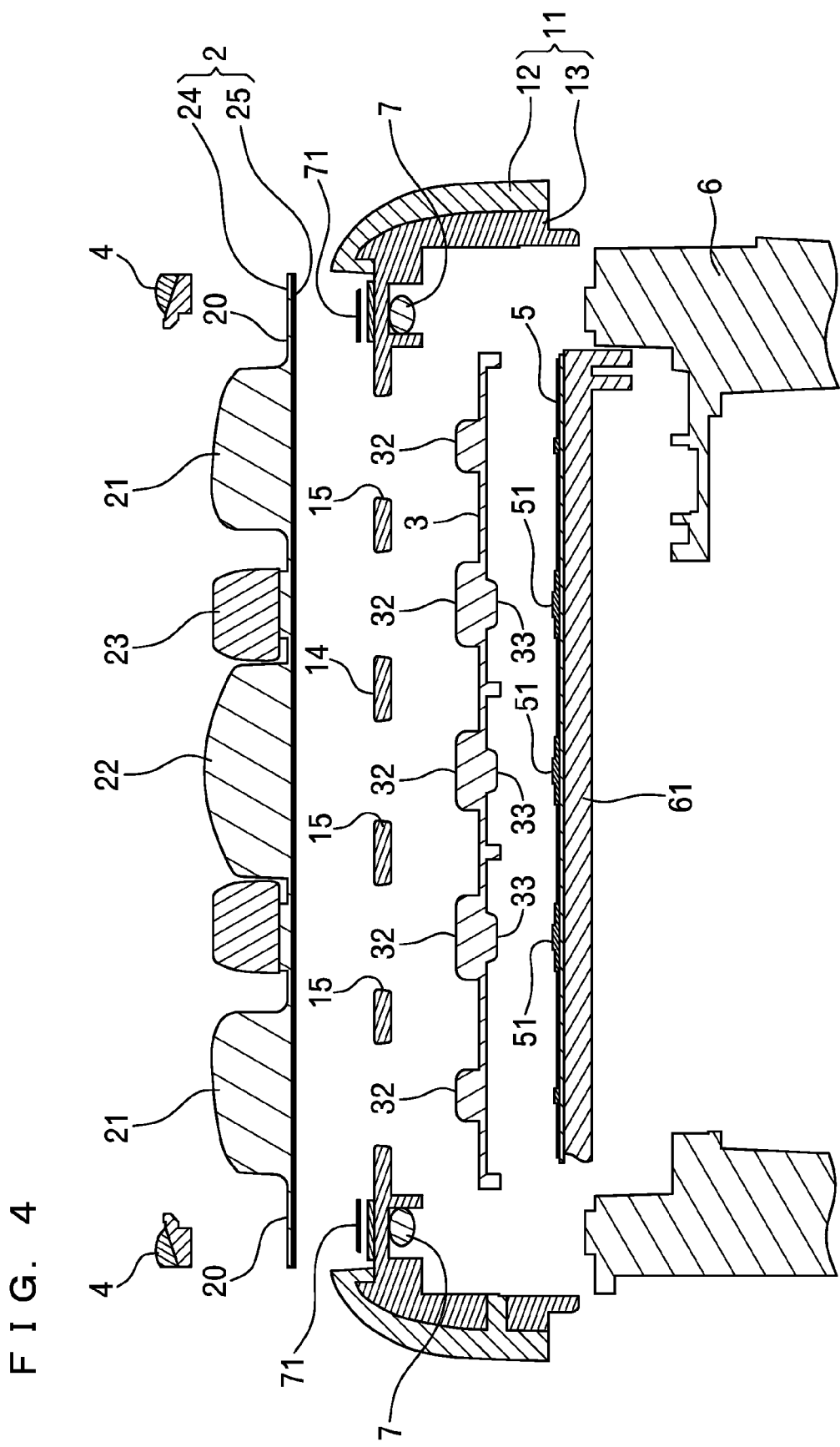
F I G. 4

WATERPROOF TYPE ELECTRONIC APPARATUS

CROSS-REFERENCE TO RELATED APPLICATIONS

The present application claims priority to Japanese patent application No. 2012-000314, the contents of which are incorporated by reference herein.

BACKGROUND OF THE INVENTION

1. Field of the Invention

The present invention relates to a waterproof type electronic apparatus including a display unit and an operation unit.

2. Description of Related Art

Conventionally, in waterproof type mobile phones, a waterproof packing is arranged between two members (e.g., a front cabinet and a back cabinet structuring the housing) forming the internal space in order to secure waterproofness for the internal space of the housing.

For example, in a mobile phone shown in FIG. 5, a display unit 90 structured by a liquid crystal display screen and the like and a plurality of operation keys 81 are arranged on the front face of the housing 9. As shown in FIG. 6, a key sheet 8 made of an elastic material is assembled from the inner side of a front panel 91 structuring the housing 9.

The key sheet 8 is integrally provided with a plurality of operation keys 81 and a plurality of pushing elements 83, and is fixed to the front panel 91 by a fixing portion 82 formed at the circumferential portion.

Further, a waterproof packing 92 comprising of an O ring is arranged on the outer side of the fixing portion 82 of the key sheet 8, to thereby secure waterproofness for the internal space of the housing 9.

However, with the waterproof type mobile phone shown in FIGS. 5 and 6, since the fixing portion 82 of the key sheet 8 and the waterproof packing 92 are arranged as being displaced in the width direction of the housing 9, that is, the width direction being shift parallel to the arranged plane of the operation keys 81, the distance (offset amount) A1 from the side face of the housing 9 to the arranged area of the operation key 81 becomes great. Accordingly, the width W1 of the arranged area of the plurality of operation keys 81 becomes narrow. As a result, there is a problem that the size of each operation key 81 becomes small, and the operability becomes poor.

Accordingly, an object of the present invention is to provide a waterproof type electronic apparatus with which the width of the arranged area of the plurality of operation keys can be increased as compared to the conventional waterproof type electronic apparatus.

SUMMARY OF THE INVENTION

A waterproof type electronic apparatus of the present invention includes, on the front face of a housing 1, a display unit 10 and an operation unit 18 provided next to each other in the direction perpendicular to the width direction of the housing 1. In the internal space of the housing 1, a switch sheet 5 to be pushed by the operation of the operation unit 18 is arranged. A waterproof packing 7 is interposed between the two members (e.g., a panel portion 13 of a front panel 11 and a resin frame 6) forming the internal space of the housing 1.

Further, the waterproof type electronic apparatus of the present invention includes a key sheet 2 at which a plurality of operation keys 21 are formed, the front panel 11 having its front face fixedly bonded to a circumferential portion 20 of the key sheet 2, and a pushing element sheet 3 interposed between the front panel 11 and the switch sheet 5.

The front panel 11 is provided with each of first opening portions 15 corresponding to ones of the operation keys 21 and one second opening portion 16 corresponding to the one display unit 10.

At the pushing element sheet 3, each of the pushing elements 31 corresponding to ones of the operation keys 21 is formed. Each of the pushing elements 31 is projecting toward ones of the operation keys 21 in the first opening portions 15 of the front panel 11.

The waterproof packing 7 extends along a loop-like path so as to pass the position where the circumferential portion 20 of the key sheet 2 and opposite side portions in the width direction of the housing 1 overlap each other, and to surround the plurality of first opening portions 15 and the one second opening portion 16.

BRIEF DESCRIPTION OF THE DRAWINGS

FIG. 4 is a cross-sectional view showing the substantial part of the mobile phone in the exploded state;

DETAILED DESCRIPTION OF THE PREFERRED EMBODIMENT

In the following, with reference to the drawings, a specific description will be given of an embodiment, in which the present invention is applied to a waterproof type mobile phone.

Figure 1:
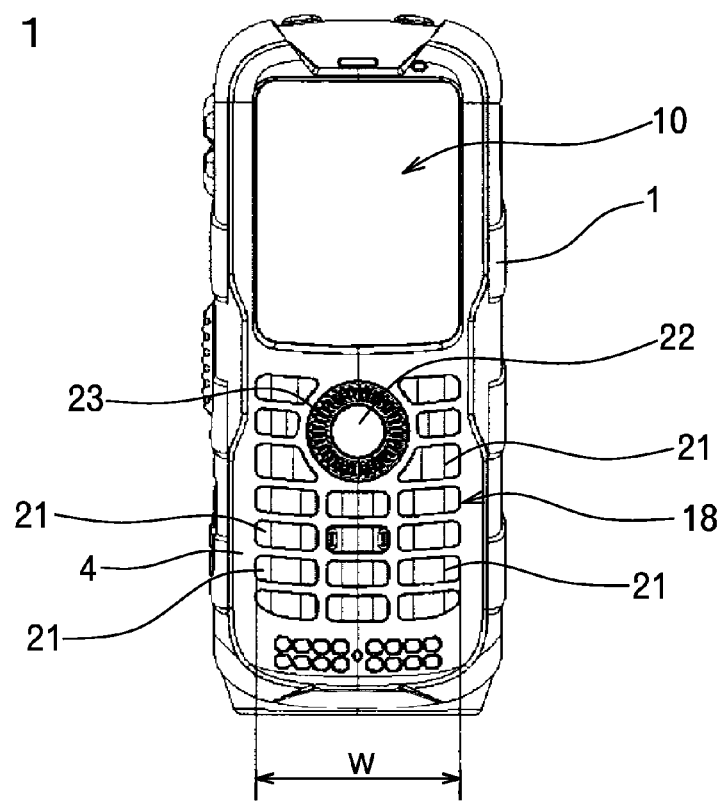
FIG. 1 is a plan view of a waterproof type mobile phone according to one embodiment of the present invention.

As shown in FIG. 1, the waterproof type mobile phone being one embodiment of the present invention includes a vertically elongated rectangular parallelepiped-like housing 1. A display unit 10 is arranged at the upper half region of the front face of the housing 1, and an operation unit 18 is arranged at the lower half region.

The operation unit 18 is structured with a plurality of keys, i.e., a numerical keypad 21, a center key 22, and a ring key 23. In the following, for convenience of explanation, the plurality of keys 21, 22, and 23 are referred to as a plurality of operation keys 21, 22, and 23.

Figure 2:
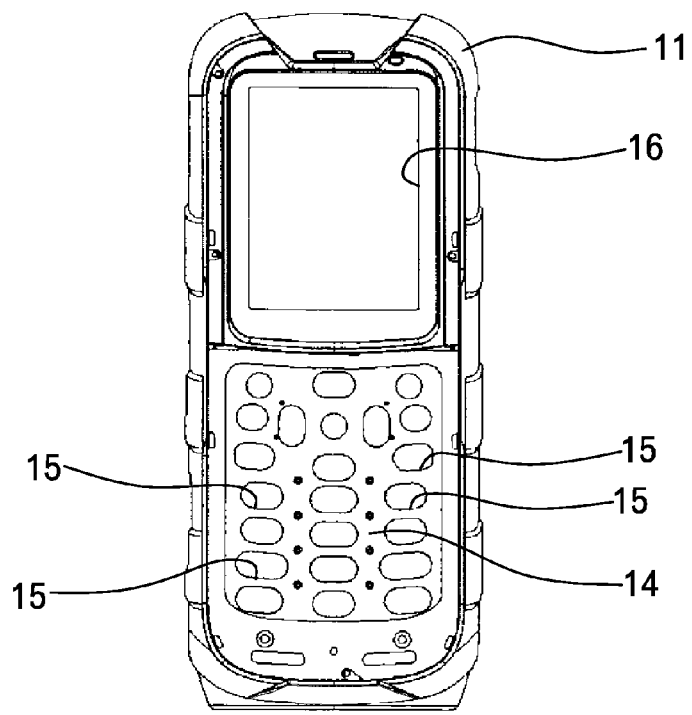
FIG. 2 is a plan view of a front panel structuring the mobile phone.

The housing 1 is structured with a front panel 11 shown in FIG. 2 and a back panel (not shown). The front panel 11 is provided with a plurality of first opening portions 15 at the positions corresponding to the plurality of operation keys 21, and a second opening portion 16 is provided at the position corresponding to the display unit 10. Among the plurality of first opening portions 15, a grid-like crosspiece portion 14 is formed.

Figure 3:
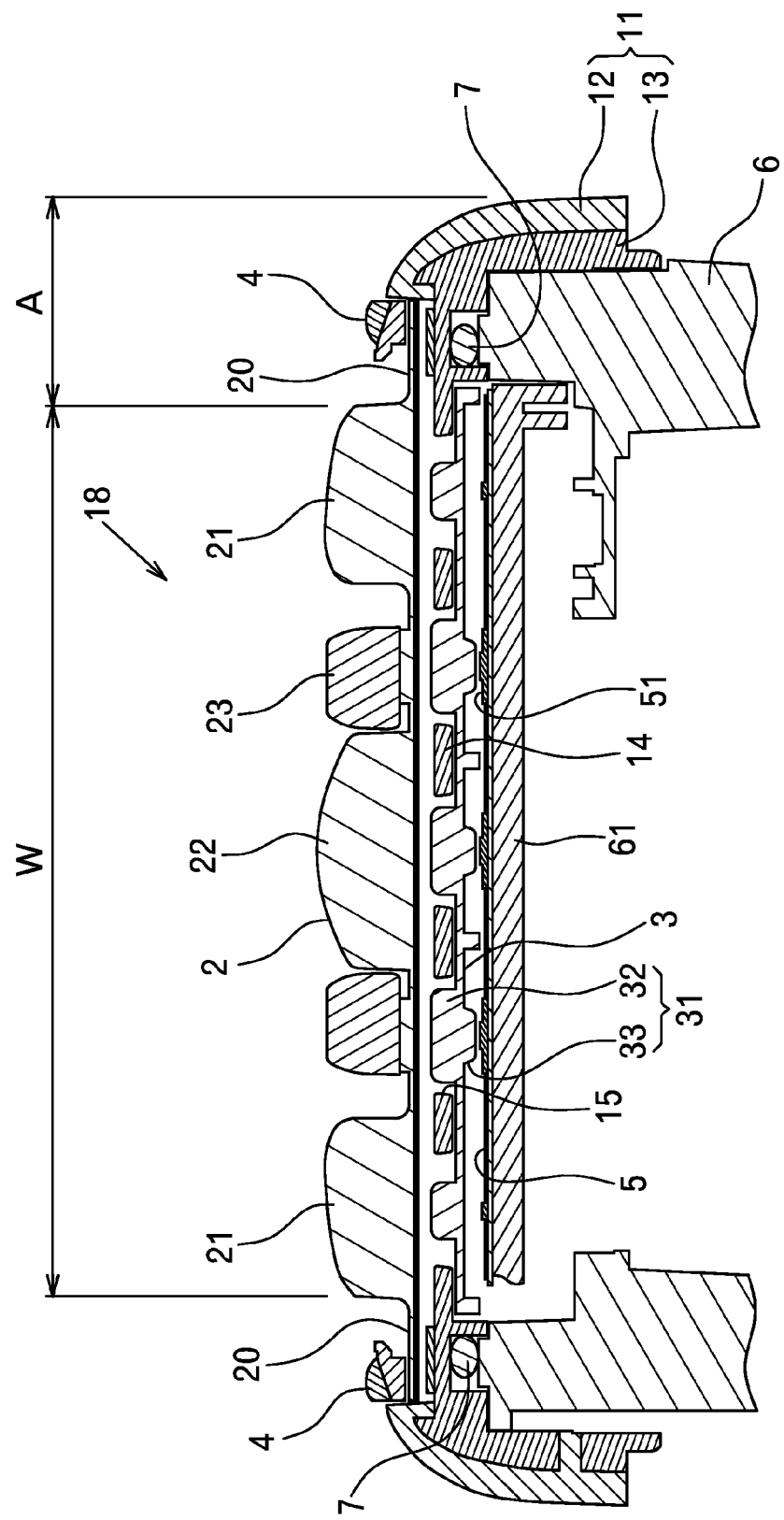
FIG. 3 is a cross-sectional view showing the substantial part of the mobile phone.

As shown in FIGS. 3 and 4, the front panel 11 is integrally structured by bonding a frame portion 12 and a panel portion 13 to each other. A key sheet 2 is arranged to cover the front face of the panel portion 13. A circumferential portion 20 of the key sheet 2 is fixedly bonded to the front face of the panel portion 13 of the front panel 11 having a waterproof tape 71 interposed therebetween.

The key sheet 2 is structured with a silicon sheet 24 in which a plurality of operation keys 21, 22, and 23 are integrally formed, and a flat plate-like urethane sheet 25 bonded to the rear face of the silicon sheet 24. The back face of the key sheet 2 forms a flat plane.

A decorative panel 4 is arranged so as to cover the front face of the circumferential portion 20 of the key sheet 2.

Further, a chassis 61 on which a switch sheet 5 is mounted is arranged on the back face side of the front panel 11. The chassis 61 is supported by a resin frame 6.

On the front face of the switch sheet 5, a plurality of metal dome switches 51 are arranged at the positions corresponding to the plurality of operation keys 21, 22, and 23.

A pushing element sheet 3 made of an elastic material such as silicone rubber is interposed between the panel portion 13 of the front panel 11 and the switch sheet 5.

On the front face of the pushing element sheet 3, a plurality of pushing elements 31 are integrally formed at the positions corresponding to the operation keys 21, 22, and 23. Each of the pushing elements 31 is structured by a pushing element upper half part 32 projecting into ones of the first opening portions 15 of the front panel 11 and a pushing element lower half part 33 projecting toward metal dome switch 51 of the switch sheet 5.

A waterproof packing 7 comprising of an O ring is interposed between the panel portion 13 of the front panel 11 and the resin frame 6.

The waterproof packing 7 is formed to be loop-like so as to pass the position where the circumferential portion 20 of the key sheet 2 and the opposite side portions in the width direction of the housing 1 overlap with each other in cross section, and to surround the plurality of first opening portions 15 and the second opening portion 16. The waterproof packing 7 is arranged in the internal space (rear face) of the housing (the front panel 11).

With the mobile phone described above, the key sheet 2 is assembled from the front face side of the front panel 11, and the circumferential portion 20 of the key sheet 2 is fixedly bonded to the front face of the front panel 11. Therefore, a gap attributed to the interposition of the front panel 11 is produced between the rear face of the key sheet 2 and the front face of the switch sheet 5. In the gap, the pushing element sheet 3 is present. When any operation key 21 of the key sheet 2 is pushed, displacement of the operation key 21 is transferred to the switch portion (metal dome switch 51) of the switch sheet 5 via the pushing element 31 of the pushing element sheet 3.

The front panel 11 is provided with the plurality of first opening portions 15. Since the grid-like crosspiece portion 14 is formed among the plurality of first opening portions 15, the front panel 11 has high rigidity.

Accordingly, when the operation key 21 is pushed, the front panel 11 itself merely elastically deforms by a small amount. In the first opening portion 15 of the front panel 11, the pushing element 31 of the pushing element sheet 3 elastically displaces, to push the metal dome switch 51 of the switch sheet 5. Thus, the contact of the metal dome switch 51 is closed.

According to the waterproof type electronic apparatus described above, since the key sheet 2 is assembled from the front face side of the front panel 11, and the circumferential portion 20 of the key sheet 2 is fixedly bonded to the front face of the front panel 11, the waterproof packing 7 can be arranged on the rear face side of the front panel 11, as being overlapped with the opposite side portions (fixing portion) in the width direction of the circumferential portion 20 of the key sheet 2.

With the waterproof packing 7 and the waterproof tape 71, waterproofness for the internal space of the housing 1 is secured.

Figure 5:
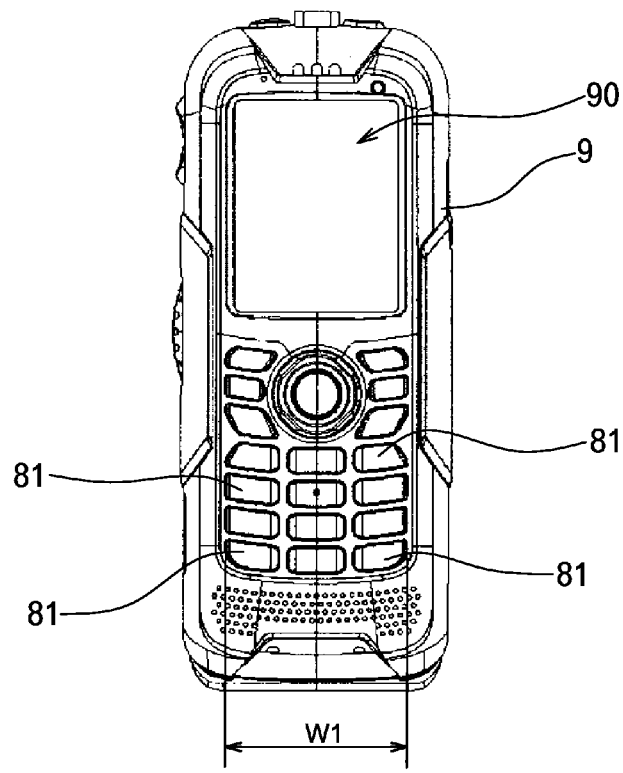
FIG. 5 is a plan view of a conventional waterproof type mobile phone.
Figure 6:
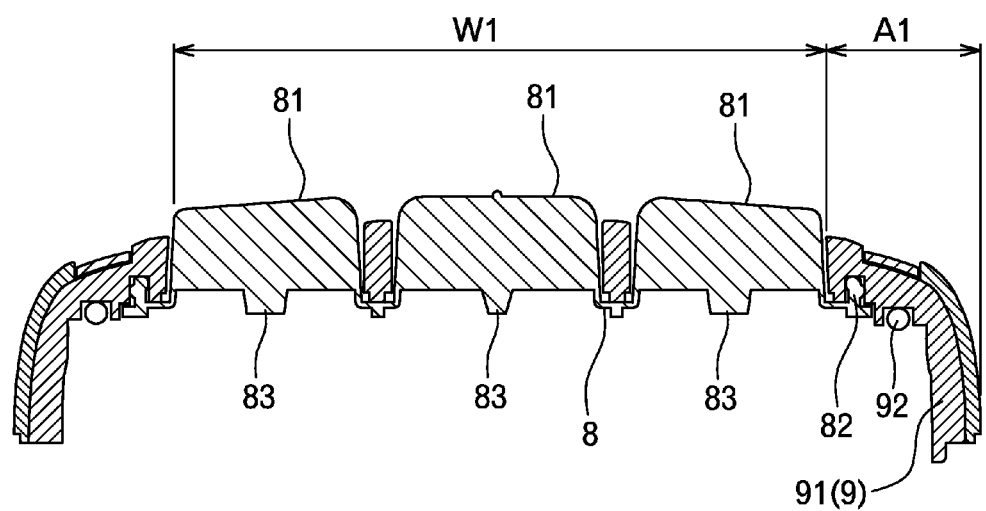
FIG. 6 is a cross-sectional view showing the substantial part of the conventional waterproof type mobile phone.

As described above, since the circumferential portion 20 of the key sheet 2 fixed to the front face of the front panel 11, the waterproof packing 7, and the waterproof tape 71 are overlapped one above the others in the cross section along the width direction of the housing 1, the distance (offset amount) A from the side face of the housing 1 to the arranged area (operation unit 18) of the operation key 21 becomes small as shown in FIG. 3. In accordance therewith, the width W of the arranged area of the plurality of operation keys 21 becomes great. For example, while the width W1 in the conventional mobile phone as shown in FIG. 5 is 36.8 mm, the width W in the mobile phone of the present invention as shown in FIG. 1 is 38.9 mm.

Thus, the size or the interval of the operation keys 21, 22, and 23 can be increased, whereby operability is improved.

It is to be noted that, the structure of each part of the present invention is not limited to the embodiment described above, and various modifications can be made by a person skilled in the art in a range not departing from the gist of the present invention described in the claims. For example, in place of the waterproof tape 71, a waterproof double sided adhesive tape can be employed.

Alternatively, in place of the switch sheet 5 provided with the metal dome switches 51, a switch sheet provided with various switch portions that respond to pushing operations can be employed.

What is claimed is:

1. A waterproof type electronic apparatus, comprising:
   a housing;
   a display unit and an operation unit that are arranged next to each other on a front face of the housing in a length direction of the housing perpendicular to a width direction of the housing;
   a switch sheet that is arranged in an internal space of the housing, the switch sheet being pushed by an operation of the operation unit;
   a waterproof packing that secures waterproofness for the internal space of the housing;
   a key sheet configured to have a plurality of operation keys;
   a front panel configured to have its front face fixedly bonded to a circumferential portion of the key sheet; and
   a pushing element sheet that is interposed between the front panel and the switch sheet,
   wherein the front panel is provided with a plurality of first opening portions respectively corresponding to the plurality of operation keys, and one second opening portion corresponding to the display unit,
   wherein, at the pushing element sheet, a plurality of the pushing elements corresponding to the plurality of the operation keys are formed, and each of the pushing elements projects inside the first opening portions of the front panel toward ones of the operation keys,
   wherein the waterproof packing is formed to be loop-like so as to surround the plurality of first opening portions and the one second opening portion,
   wherein, in a depth direction that is perpendicular to both the length direction and the width direction, a position of at least a portion of the waterproof packing overlaps a position of at least a portion of the circumferential portion of the key sheet that is fixedly bonded to the front face of the front panel, and wherein the waterproof packing is arranged at a rear face of the front panel.

2. The waterproof type electronic apparatus according to claim 1, wherein the pushing elements of the pushing element sheet are structured by a pushing element upper half part projecting toward the operation keys of the key sheet, and a pushing element lower half part projecting toward the switch sheet.

3. The waterproof type electronic apparatus according to claim 2, wherein the waterproof packing is compressed between the front panel and a resin frame supporting, in the housing, the switch sheet arranged in the housing.

4. The waterproof type electronic apparatus according to claim 2, wherein the key sheet is structured by a first elastic sheet and a flat plate-like second elastic sheet bonded to a rear face of the first elastic sheet, the plurality of operation keys being formed at a front face of the first elastic sheet.

5. The waterproof type electronic apparatus according to claim 1, wherein the waterproof packing is compressed between the front panel and a resin frame supporting, in the housing, the switch sheet arranged in the housing.

6. The waterproof type electronic apparatus according to claim 1, wherein the key sheet is structured by a first elastic sheet and a flat plate-like second elastic sheet bonded to a rear face of the first elastic sheet, the plurality of operation keys being formed at a front face of the first elastic sheet.

\* \* \* \* \*